US005956573A

United States Patent [19]
Dinan et al.

[11] Patent Number: 5,956,573
[45] Date of Patent: Sep. 21, 1999

[54] USE OF ARGON SPUTTERING TO MODIFY SURFACE PROPERTIES BY THIN FILM DEPOSITION

[75] Inventors: Thomas E. Dinan, Danbury, Conn.; Swami Mathad; Paul A. Totta, both of Poughkeepsie, N.Y.; Horatio S. Wildman, Wappingers Falls, N.Y.

[73] Assignee: International Business Machines Corporation, Armonk, N.Y.

[21] Appl. No.: 08/785,186

[22] Filed: Jan. 17, 1997

[51] Int. Cl.$^6$ .......................... H01L 21/203; H01L 21/60
[52] U.S. Cl. ........................... 438/106; 438/695; 438/118
[58] Field of Search ............................................. 438/106

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller | 29/840 |
| 4,673,772 | 6/1987 | Satoh et al. | 174/52.4 |
| 5,060,844 | 10/1991 | Behun et al. | 228/180.21 |
| 5,071,714 | 12/1991 | Rodbell et al. | 428/620 |
| 5,130,779 | 7/1992 | Agarwala et al. | 257/772 |
| 5,153,385 | 10/1992 | Juskey et al. | 174/260 |
| 5,274,913 | 1/1994 | Grebe et al. . | |
| 5,292,688 | 3/1994 | Hsiao et al. | 29/840 |
| 5,503,286 | 4/1996 | Nye, III et al. | 216/13 |
| 5,656,862 | 8/1997 | Papathomas et al. | 257/778 |
| 5,668,059 | 9/1997 | Christie et al. | 438/118 |

OTHER PUBLICATIONS

S. Wolf et al. "Silicon Processing for the VLSI Era, vol. 1: Process Technology" pp. 335, 340–373, 1986.
IBM Technical Disclosure Bulletin, vol. 33, No. 10A, Mar. 1991, S.K. Kang and P. Murphy.

*Primary Examiner*—Peter Toby Brown
*Assistant Examiner*—Maria Guerrero
*Attorney, Agent, or Firm*—Scully, Scott, Murphy & Presser; Joseph P. Abate

[57] ABSTRACT

A method of selectively and simultaneously depositing a non-reactive material such as a polyimide polymer to vertical sidewalls of a mesa-like structure is provided. The method of the present invention is useful in providing a modified mesa-like structure which prevents the flow of a reactive material along the vertical sidewalls of the mesa-like structure.

19 Claims, 4 Drawing Sheets

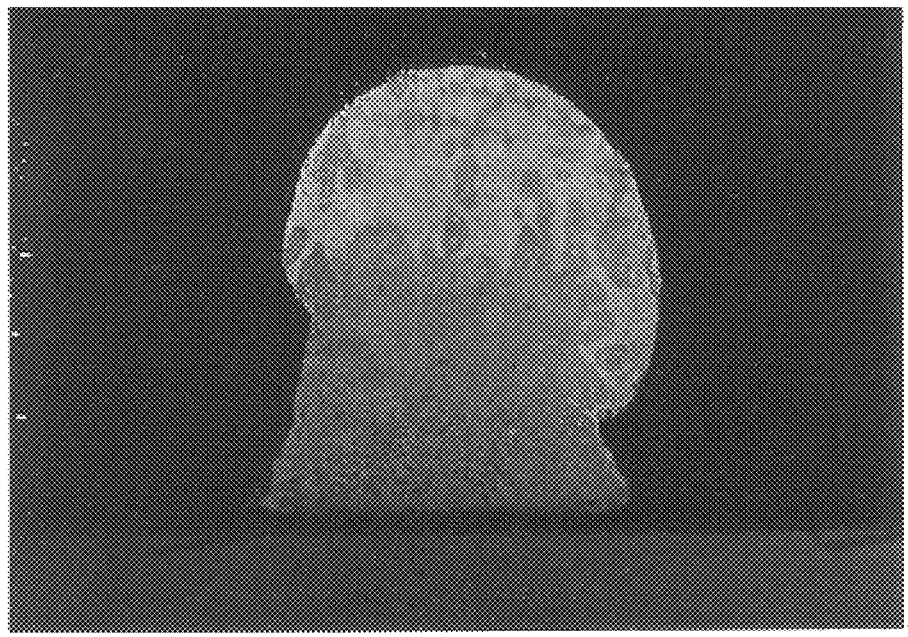
FIG.I(c)
PRIOR ART
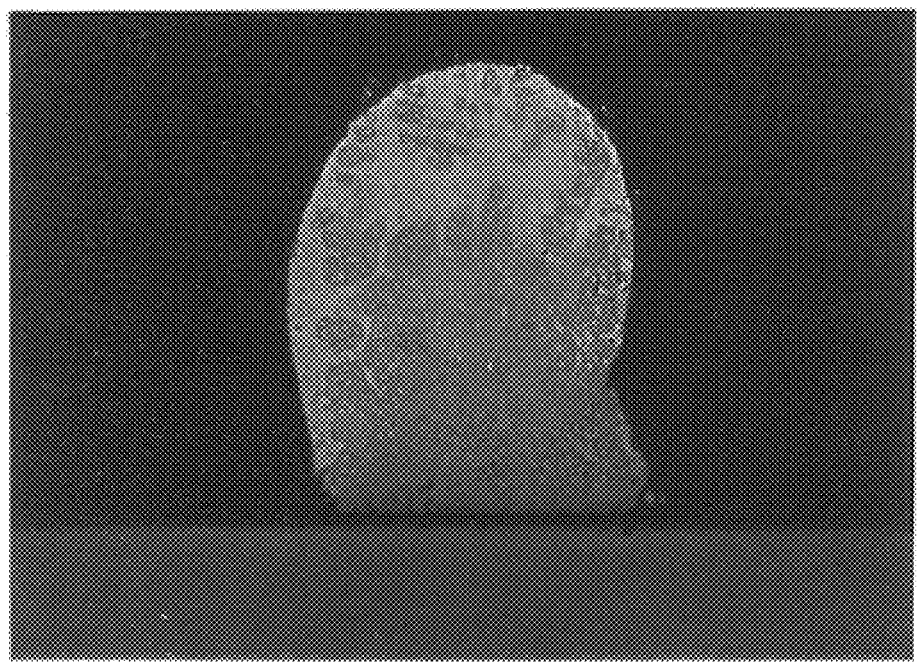
FIG.I(d)
PRIOR ART

USE OF ARGON SPUTTERING TO MODIFY SURFACE PROPERTIES BY THIN FILM DEPOSITION

FIELD OF THE INVENTION

The present invention relates to a method of selectively depositing a non-reactive material such as a polyimide polymer onto vertical or substantially vertical sidewalls of a mesa-like structure, but not onto an exposed horizontal surface of the mesa-like structure, so as to reduce deformation, collapse or reaction of the mesa-like structure during a subsequent processing step such as soldering. Instead, the exposed horizontal surface of the mesa-like structure is simultaneously cleaned during the sputtering process of the present invention thus making the exposed horizontal surface more reactive during a subsequent processing step. A modified mesa-like structure containing the non-reactive material on its vertical or substantially vertical sidewalls is also provided herein which eliminates the flow or wetting of another species such as solder along the vertical sidewalls of the mesa-like structure during soldering.

PRIOR ART

In recent years, semiconductor chip manufactures have moved away from using pins as connectors for electronic packaging due to the high cost of fabrication, the unacceptable percentage of failed connections which require rework, the limitations on I/O density and the electrical limitations of the relatively high resistance connectors. Solder balls are superior to pins in all of the above features as well as being surface mountable, which has obvious implications given the increasingly small dimensions in chip manufacturing.

Solder mounting is hardly a new technology, itself. But, the need remains to improve the solder systems and configurations in electronic structures. The use of solder ball connectors has been applied to the mounting of integrated circuit chips using the so-called C-4 (controlled collapse chip connection) technology since the method and structure were first described and patented in U.S. Pat. Nos. 3,401,126 and 3,429,040 both of which are assigned to the present assignee. A myriad of solder structures have since been proposed for the mounting of IC chips, as well as for interconnection of other levels of circuitry and associated electronic packaging.

The basic structure is that of a minute solder portion, generally a ball, connected to a bonding site on one of the parts to be electrically joined. The assembly or part, bonding pad and solder, is then brought into contact with a solderable pad on a second part and the solder is reflowed to achieve the connection. The "second" part will hereinafter be referred to as a board, although it is evident and fully intended from the context of the subject invention that the second part can be a substrate, a card, a board, a chip or any other electronic part to which electrical connection is desired.

One of the major drawbacks to this configuration is that the solder balls do not always retain their shape prior to connection, or during processing, or during rework. During rework, not only the solderable pad but also the solder, itself, becomes molten. There is no guarantee, therefore, that the solder will retain their desired shape during processing associated with the first part.

One potential solution to the above problem is to use a sandwich structure such as is illustrated in U.S. Pat. No. 4,673,772 to Satoh, et al. wherein a high melting point (hereinafter HMP) solder column is connected to the part with a lower melting point solder. The part, low melting point (hereinafter LMP) solder and HMP solder are then placed into contact with a LMP solder portion of a second part, or hereinafter board, to which it is desired to electrically connect said first part. The assembly is then heated to a temperature sufficient to melt the LMP solder and achieve the connection.

One major drawback with the prior art structures, including Satoh, et al. is that, during heating for attachment, the LMP solder—which is sometimes referred to as high-tin solder—will melt and creep down the side of the C-4. This occurs after two reflows if there is no barrier for the movement of the solder. When creeping of the LMP solder occurs, it may come into contact with the current ball limiting metallurgy (BLM) of the part being soldered and damage it by dissolving the copper-tin intermetallic. FIGS. 1(a)–(d) are SEM photographs at 500× magnification which illustrates this problem associated with prior art soldering techniques. In each of these figures, the high-tin cap solder having a LMP solder has begun to melt and to creep along the side of the C-4.

Another drawback is that the HMP solder can not be reflowed, i.e. remelted, prior to solder joining without its deformation and/or collapse due to the high surface tension of its surface.

Various methods of depositing passivating films onto connector contacts using techniques like chemical vapor deposition, sputtering, spin-coating and the like have been developed to overcome the creeping problem mentioned hereinabove. These prior art methods are disclosed, for example, in U.S. Pat. Nos. 5,060,844 to Behun, et al., 5,130,779 to Agarwala, et al. and 5,274,913 to Grebe, et al. as well as IBM Technical Bulletin entitled, "Controlled Solder Dam Structure by Special Evaporation—Gun Design", Vol. 29, No. 11, April 1987 pp. 48–49; and IBM Technical Disclosure Bulletin entitled "Tape Structure for Controlled Solder Attachment", Vol. 33, No. 10, March 1991, pp. 38–39.

Despite the current development of such processes in semiconductor chip manufacturing, the prior art processes do not simultaneously and selectively render predetermined surfaces of a mesa-like structure non-reactive while maintaining the reactivity of other surfaces of the mesa-like structure.

Hence, there still exists a need to develop a new method which simultaneously and selectively deposits a non-reactive material only onto the vertical sidewalls of a mesa-like structure while simultaneously cleaning an exposed horizontal surface of the mesa-like structure so as to render it more reactive during a subsequent process such as soldering.

SUMMARY OF THE INVENTION one object of the present invention is to provide a method of selectively depositing a non-reactive material only to the vertical or substantial vertical sidewalls of a mesa-like structure which prevents a reactive species, such as solder, from flowing, depositing or reacting on the vertical sidewalls of the mesa-like structure during a subsequent process, such as solder reflow or solder joining.

Another object of the present invention is to provide a method which simultaneously and selectively deposits a non-reactive material to the vertical or substantially vertical sidewalls of a mesa-like structure while cleaning an exposed horizontal surface of the mesa-like structure of passivating films so as to render the exposed horizontal surface of the mesa-like structure more reactive in a subsequent processing step.

These as well as other objects are achieved by the method of the present invention which comprises the steps of:

(a) providing a mesa-like structure, said mesa-like structure having an exposed horizontal surface, a horizontal surface attached to a microelectric device, and vertical or substantially vertical sidewalls; and (b) subjecting said mesa-like structure to sputtering under conditions which are sufficient to cause deposition of a non-reactive material to said vertical or substantially vertical sidewalls of the mesa-like structure while simultaneously cleaning the exposed horizontal surface of the mesa-like structure.

The term "mesa-like structure" is used herein to denote any structure which contains vertical or substantially vertical, i.e. tapered, sidewalls, a flat exposed horizontal surface and another horizontal surface which is attached to a microelectronic device such as a substrate, wafer, board or card. Examples of mesa-like structures contemplated in the present invention include, but are not limited to, solder bumps (C-4 solder bumps before reflow or solder columns before reflow), ball grid arrays, and raised line structures such as metal line interconnects on semiconductor wafers and polysilicon lines on semiconductors wafers.

The above method provides a non-reactive surface modifying material to the vertical sidewalls of a mesa-like structure such as solder bumps which prevents a reactive material, e.g. solder, from flowing, depositing or reacting on the sidewalls of the mesa-like structure in a subsequent processing step. For example, when the subsequent processing step comprises a C-4 process which includes one or more steps that melt low tin solder in $H_2$ or with a flux to homogenize the solder, the melting steps cause the C-4 to collapse into a hemisphere due to the high surface tension of a clean molten solder surface. The reliability of the eventual joint to the second part depends not only on the difference in thermal expansion coefficients but also on the distance between the two parts after joining. The greater the distance the better the reliability of the joint. The method of the present invention reduces the deformation and/or collapse of this HMP solder during the reflow process by reducing the surface tension of the vertical sidewalls. Since the HMP solder does not melt during the solder joining process to the LMP solder on the second part, the distance between the joined parts will be greater if the C-4 has not completely collapsed to a hemisphere. Moreover, the surface modifying, non-reactive material deposited by the present invention prevents high tin solder from wetting the HMP solder on the side of a semiconductor joint. Hence, the present invention results in an improved reliability of the joint by preventing creeping along the vertical sidewalls of the mesa-like structure.

Another aspect of the present invention thus relates to a modified mesa-like structure which contains a non-reactive material on its vertical sidewalls which during a subsequent processing step such as soldering prevents a reactive material, e.g. solder, from creeping along the vertical sidewalls.

BRIEF DESCRIPTION OF THE DRAWINGS

FIGS. 1(a)–(d) are cross-sectional views of a prior art high-tin capped, low-tin standoff C-4.

DETAILED DESCRIPTION OF THE PRESENT INVENTION

Figure 1A:
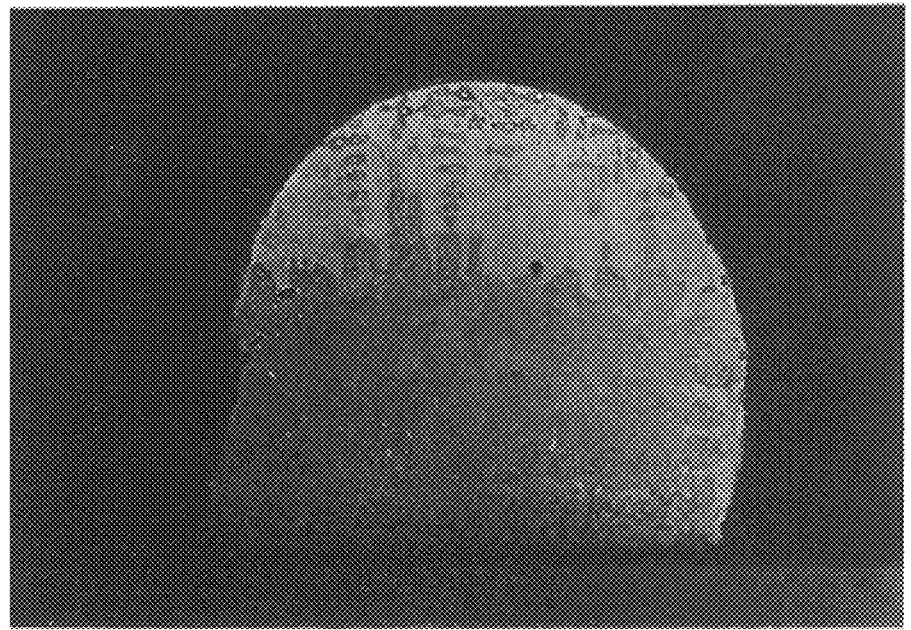
Figure 1B:
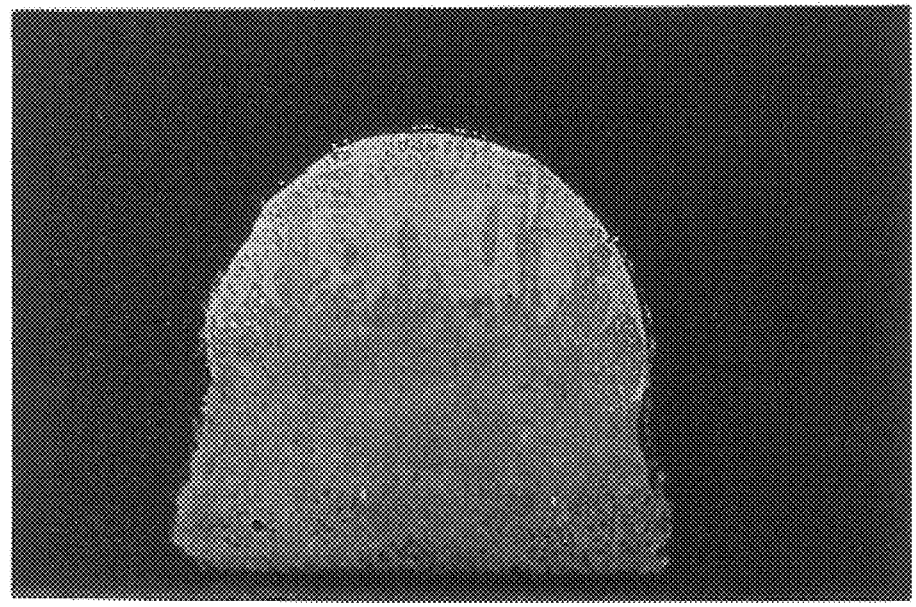

As stated above, one aspect of the present invention relates to a method of selectively and simultaneously depositing a non-reactive material to the vertical or substantially vertical sidewalls of a mesa-like structure while simultaneously cleaning an exposed horizontal surface of the mesa-like structure to render the exposed horizontal surface more reactive in a subsequent processing step.

In accordance with the present invention, a mesa-like structure which has vertical sidewalls, i.e., sides perpendicular to the plane of a microelectronic device; and horizontal surfaces, i.e., surfaces parallel to the plane of a microelectronic device, is provided. One of the horizontal surfaces of the mesa-like structure employed in the present invention is exposed whereas the other horizontal surface of the mesa-like structure is attached to a microelectric device such as a substrate, wafer, board or card. The mesa-like structures employed in the present invention include, but are not limited to, solder bumps such as C-4 solder bumps before reflow and solder columns before reflow, ball grid arrays and raised line structures such as metal line interconnects on semiconductor wafers and polysilicon lines on semiconductor wafers. A highly preferred mesa-like structure employed in the instant invention is a C-4 solder bump or column before reflow which comprises a low tin, i.e. high melting point, solder and a non-reactive material which is present at the base of the attached horizontal surface of the mesa-like structure.

The mesa-like structures employed in the present invention are manufactured using techniques well known to those skilled in the art and thus there is no need to describe herein how such structures are made.

In the next step of the present invention, a non-reactive material is selectively deposited onto the vertical sidewalls of the mesa-like structure by sputtering. It is emphasized that the sputtering conditions employed in the present invention are effective for selectively depositing the non-reactive material to the vertical sidewalls of the mesa-like structure, while preventing any deposition of the non-reactive material to the exposed horizontal surface of mesa-like structure. Instead, the sputtering conditions are sufficient to clean the exposed horizontal surface of the mesa-like structure and thereby provide a horizontal surface which is more reactive than the vertical or substantially vertical sidewalls of the mesa-like structure.

More specifically, in the present invention, the rate of depositing the non-reactive material to the vertical or substantially vertical sidewalls is equal to the difference between the rate of deposition and the rate of removal by sputtering. For surfaces that are nearer to the horizontal, the rate of sputter removal is maintained greater than the rate of deposition by adjusting the energy and flux of the bombarding species so that a film of the non-reactive material can not grow on the exposed horizontal surface. At sputtering equilibrium, only an insignificant amount of the non-reactive material is present on the exposed horizontal surface of the mesa-like structure. As stated above, the sputtering conditions employed in the present invention are sufficient to clean the exposed horizontal surface of the mesa-like structure and thereby provide a horizontal surface which is more reactive in a subsequent processing step than are the vertical sidewalls. For example, when soldering is employed as the subsequent processing step, the exposed horizontal surface of the C-4 solder bump is made more reactive, i.e. wettable, than the vertical side walls of the mesa-like structure which contains the non-reactive film. On the other hand, for surfaces which are vertical or substantially vertical, the angle dependent sputter removal rate is less than the deposition rate of the non-reactive material so that a film grows on those surfaces.

In accordance with the present invention, the non-reactive material is deposited simultaneously to sputtering. Suitable deposition mechanisms are those that insure sufficient edge coverage, and include, but are not limited to, chemical vapor deposition, direct sputtering, and the like thereof. A highly preferred mechanism employed in the present invention is direct sputter deposition by an inert gas at an incident angle normal, i.e., perpendicular, to the exposed horizontal surface of the mesa-like structure. Suitable inert gases that may be employed in the present invention include He, Ar, Ne, Kr or Xe. Mixtures of these inert gases are also contemplated herein. Of the inert gases mentioned hereinabove, Ar is highly preferred.

The inert gas employed in the present invention may be used as is, or it may be purified prior to sputtering using purification techniques well known to those skilled in the art. For example, the inert gas may be purified by passing it through a column containing an adsorbent which is effective in adsorbing any impurities from the inert gas.

In accordance with the method of the present invention, the kinetic energy of the sputtering species is typically from about 30 to about 2000 eV. More preferably, the kinetic energy of the sputtering species being deposited is from about 250 to about 750 eV.

In accordance with the present invention, the inert gas is typically introduced into the reactor chamber of a sputtering apparatus at a flow rate of from about 5 to about 25 sccm. More preferably, the flow rate of the inert gas employed in the present invention is from about 5 to about 8 sccm. It should be emphasized however that the flow rate may vary depending on the size of the reactor chamber and the differential pumping speed of the sputtering apparatus.

In the present invention, sputtering of the non-reactive material is typically carried out at a pressure of from about 5 to about 40 millitorr. The sputtering pressure employed in the present invention is from about 30 to about 40 millitorr.

The power of the sputtering apparatus employed in the present invention to achieve selective deposition of the non-reactive material onto the vertical sidewalls of the mesa-like structure may vary; however, it is typically from about 100 to about 400 watts whereas the wafer-bias voltage employed in the present invention is typically from about 300 to about 800 volts. More preferably, sputtering is conducted at a power of from about 300 to about 400 watts and at a wafer-bias voltage of from about 300 to about 800 volts.

In accordance with the present invention, sputtering of the non-reactive material is carried out at a temperature of from about 15 to about 200° C. for a time period of from about 1 to about 5 min. More preferably, sputtering is carried out at a temperature of from about 15 to about 50° C. for a period of time of from about 3 to about 4 min.

Using the above sputtering parameters and conditions, a film of said non-reactive material having a thickness of from about 0.2 to about 200 nm is deposited only onto the vertical or substantially vertical sidewalls of the mesa-like structure while simultaneously cleaning the exposed horizontal surface of the mesa-like structure. More preferably, the sputtered non-reactive film has a thickness of from about 10 to about 50 nm.

The term "non-reactive" material as used herein denotes a material which under soldering conditions is non-wettable. This normally means that its surface tension is low compared to the surface tension of the solder and can not be further lowered by reaction with the solder. The non-reactive material may be present on the base of the mesa-like structure prior to conducting the method of the present invention, or it may be applied simultaneously to the mesa-like structure during the method of the present invention using techniques such as chemical vapor deposition, sputtering or the like thereof. Suitable non-reactive materials which may be deposited onto the vertical sidewalls of the mesa-like structure by the above mentioned sputtering process include, but are not limited to, polyolefins, e.g., polyethylene, polypropylene, polybutylene and the like thereof; polyimides; polyamides; oxides; nitrides or metals which readily oxidize such as Ti, W, Si. Copolymers of the above mentioned polymers are also contemplated herein.

In a highly preferred embodiment of the present invention wherein C-4s are employed as the mesa-like structure, the non-reactive material employed is a polyimide polymer which contains a phtalimide structure in the polymer backbone. By phthalimide structure, it is meant a polymer which contains the following repeating unit in the backbone of the polymer:

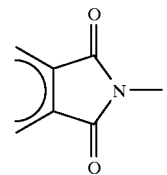

Typical polyimide polymers that may be employed in the present invention are well known to those skilled in the art and are described, for example, in Kirk-Othmer "Encyclopedia of Chemical Technology, Vol. 18, 1982, pp. 704–719. A highly preferred polyimide polymer employed in the present invention is pyromellitic dianhydride oxydianiline (PMDA-ODA).

In one embodiment of the present invention, the mesa-like structure is a C-4 solder bump which consists of a cap of high tin solder and a column of low tin solder. By "low tin solder" it is meant a high melting point PbSn solder which contains about 95 to about 97 wt % Pb and about 3 to about 5 wt % Sn. In contrast, thereto, high tin solder is a low melting point PbSn solder which contains from about 30 to about 50 wt % Pb and from about 70 to about 50 wt % Sn. A non-reactive material such as PMDA-ODA is then deposited only onto the vertical sidewall of the C-4 structure and then the C-4 structure is heated under reflow conditions which are sufficient to reflow the high tin solder cap but not the low tin column which remains a solid, unmelted material.

Generally, in the present invention, the foregoing heating step is conducted at a temperature of from about 180 to about 240° C. for a period of time from about 1 to about 5 min. More preferably, the reflow step is conducted at a temperature of from about 220 to about 230° C. for a period of time of from about 1 to about 3 min.

In accordance with another aspect of the present invention, a modified mesa-like structure comprising a mesa-like structure having a non-reactive material only on its vertical sidewalls is provided. Such a modified semiconductor structure is useful in preventing reactive material from creeping along the sidewalls of the mesa-like structure and thus it prevents the reactive material from damaging the current ball limiting metallurgy of the part being processed.

The following example is given to illustrate the scope of the present invention. Because this example is given for illustrative purposes only, the invention embodied therein should not be limited thereto.

EXAMPLE

In this example, a polyimide polymer was deposited on the sidewalls of a C-4 composed of high melting point PbSn solder using Ar sputtering in accordance with the method of the present. The polyimide polymer employed in this example was PMDA-ODA. The Ar sputtering parameters used for selectively depositing the polyimide polymer onto the vertical sidewalls of the C-4 were as follows:

Ar flow: about 5 sccm.

Pressure: about 36 millitorr.

Power: about 300 watts.

Wafer-bias: about 500 volts.

Time: about 4 min.

Temperature: about 35° C.

The above conditions were sufficient to deposit a polyimide film having a thickness of about 3 nm onto the vertical sidewalls of the C-4. No polyimide film however was deposited on the exposed horizontal surfaces of the C-4.

Figure 2:
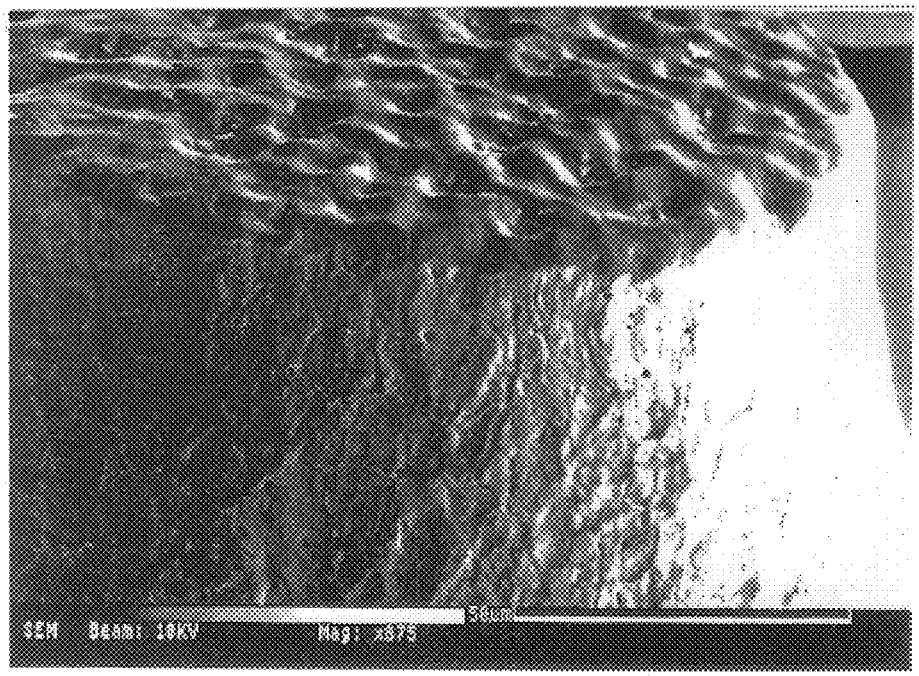
FIG. 2 is a SEM photograph of a C-4 which has been subjected to sputtering in accordance with the method of the present invention.

A thin film of Au was then deposited at room temperature over the entire surface of the C-4 and a SEM of the sample was taken. The SEM photograph of this sample is shown in FIG. 2. As is illustrated therein, the Au film alloyed at room temperature with the top of the C-4 but was still present in pure form on the polyimide modified sidewall of the C-4. That is, FIG. 2 clearly shows that the method of the present invention selectively deposited a polyimide film on the vertical sidewalls of the C-4 whereas the exposed horizontal surface contained no such material thereon. Instead, the exposed horizontal surface of the C-4 was cleaned by the sputtering process of the present invention.

Figure 3:
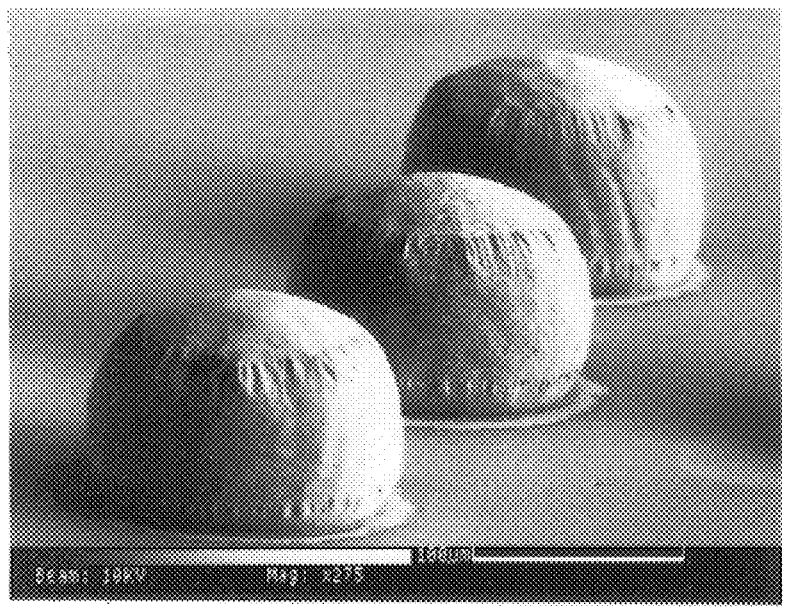
FIG. 3 is a SEM photograph of HMP C-4s prepared in accordance with the present invention after reflow.
Figure 4:
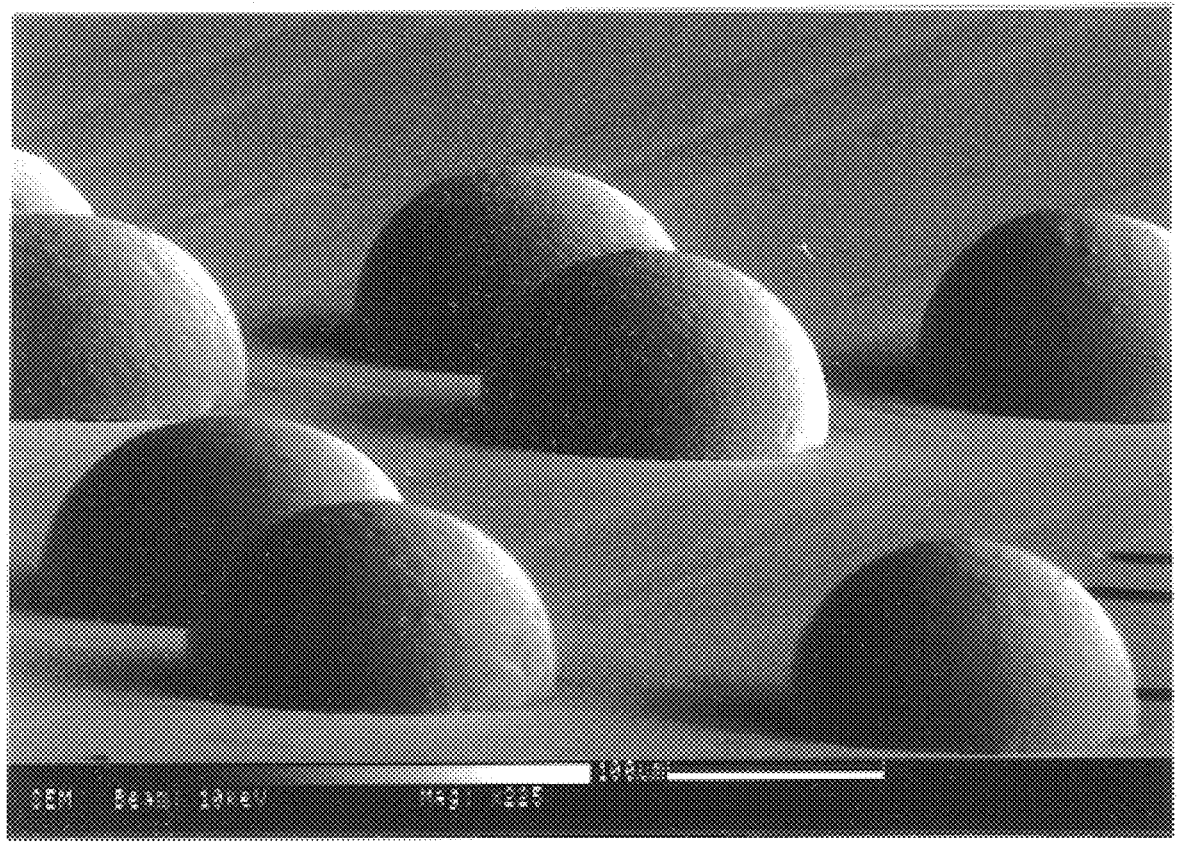
FIG. 4 is a SEM photograph of prior art HMP C-4s after reflow.

The C-4 was then heated under reflow conditions at a temperature of about 365° C. The results of this experiment are shown in FIG. 3. Specifically, FIG. 3 shows that the top of the C-4 had reflowed but the sides had been constrained because of the polyimide film present thereon. Moreover, the C-4 had been prevented from reflowing into a spherical shape because the polyimide film had modified the surface properties and reduced the surface tension thereof. In contrast thereto, FIG. 4 which shows a SEM of prior art HMP-tin C-4, has a squat hemisphere as compared to the C-4 shown in FIG. 3. In other words, the prior art HMP C-4 collapsed whereas the C-4 of the present invention did not.

While the invention has been particularly shown and described with respect to preferred embodiments thereof, it will be understood by those skilled in the art that the foregoing and other changes in form and detail may be made without departing from the spirit and scope of the invention.

Having thus described our invention, what we claim as new, and desire to secure by Letters Patent is:

1. A method of selectively and simultaneously depositing a non-reactive material to vertical or substantially vertical sidewalls of a mesa-like structure comprising the steps of:

(a) providing a mesa-like structure, said mesa-like structure being a solder bump, a ball grid array or a raised line structure having an exposed horizontal surface, an unexposed horizontal surface and vertical or substantially vertical sidewalls; and (b) subjecting said mesa-like structure to sputtering under conditions sufficient to cause deposition of a non-reactive material to said vertical or substantially vertical sidewalls of said mesa-like structure so as to reduce deformation, collapse or reaction of said vertical or substantially vertical sidewalls of said mesa-like structure during a subsequent processing step while simultaneously cleaning the exposed horizontal surface of said mesa-like structure so as to render the exposed horizontal surface of said mesa-like structure reactive in a subsequent processing step.

2. The method of claim 1 wherein said raised line structure is a metal line interconnect on a semiconductor wafer or a polysilicon line on a semiconductor wafer.

3. The method of claim 1 wherein said mesa-like structure is a solder bump comprising a controlled collapse chip connector (C-4) solder bump before reflow or a C-4 solder column before reflow.

4. The method of claim 3 wherein said solder bump comprises PbSn solder which contains from about 95 to about 97 wt % Pb and from about 3 to about 5 wt % Sn.

5. The method of claim 1 wherein the unexposed horizontal surface is connected to a microelectronic device.

6. The method of claim 5 wherein said microelectronic device is a substrate, board, wafer or card.

7. The method of claim 1 wherein said sputtering is conducted using an inert gas selected from the group consisting of Ar, He, Ne, Xe and Kr.

8. The method of claim 7 wherein said sputtering is conducted using Ar gas.

9. The method of claim 1 wherein said sputtering is conducting at an incident angle normal to the exposed horizontal surface.

10. The method of claim 1 wherein said sputtering is carried out at a pressure of from about 5 to about 40 millitorr.

11. The method of claim 1 wherein said sputtering is carried out at a temperature of from about 15 to about 200° C. for a period of time from about 1 to about 5 min.

12. The method of claim 1 wherein said sputtering is carried out such that the kinetic energy of the sputtering is from about 300 to about 2000 eV.

13. The method of claim 1 wherein said sputtering is conducting at a power of from about 100 to about 400 watts and at a wafer-bias voltage of from about 300 to about 800 volts.

14. The method of claim 1 wherein said non-reactive material is a polymer, an oxide, a nitride or an oxidizable metal.

15. The method of claim 14 wherein said polymer is selected from the group consisting of a polyolefin polymer, a polyimide polymer, a polyamide polymer, and copolymers thereof.

16. The method of claim 15 wherein said polymer is a polyimide polymer having a phthalimide structure in the polymer backbone, wherein said phthalimide structure has the following formula:

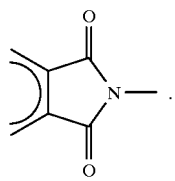

17. The method of claim 16 wherein said polyimide is pyrometallic dianhydride oxydianiline.

18. The method of claim 1 wherein said non-reactive material is deposited to a thickness of from about 0.2 to about 200 nm.

19. The method of claim 18 wherein said non-reactive material is deposited to a thickness of from about 10 to about 50 nm.

* * * * *